(12) United States Patent
Andre et al.

(10) Patent No.: US 9,933,710 B2
(45) Date of Patent: Apr. 3, 2018

(54) PROJECTION EXPOSURE METHOD AND PROJECTION EXPOSURE APPARATUS

(71) Applicant: Carl Zeiss SMT GmbH, Oberkochen (DE)

(72) Inventors: Stephan Andre, Schwaebisch Gmuend (DE); Daniel Golde, Oberkochen (DE); Toralf Gruner, Aalen-Hofen (DE); Johannes Ruoff, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/470,007

(22) Filed: Mar. 27, 2017

(65) Prior Publication Data

US 2017/0285493 A1    Oct. 5, 2017

(30) Foreign Application Priority Data

Apr. 5, 2016 (DE) .................. 10 2016 205 617

(51) Int. Cl.
| | | |
|---|---|---|
| *G03B 27/32* | (2006.01) | |
| *G03B 27/68* | (2006.01) | |
| *G03F 7/20* | (2006.01) | |
| *G03F 9/00* | (2006.01) | |

(52) U.S. Cl.
CPC .......... *G03F 7/70775* (2013.01); *G03F 7/201* (2013.01); *G03F 7/2004* (2013.01); *G03F 7/70233* (2013.01); *G03F 7/70525* (2013.01); *G03F 7/70725* (2013.01); *G03F 9/70* (2013.01)

(58) Field of Classification Search
CPC .... G03F 7/201; G03F 7/2004; G03F 7/70091; G03F 7/70233; G03F 7/70525; G03F 7/70725; G03F 9/70
USPC ...................................... 355/52, 77
See application file for complete search history.

(56) References Cited

U.S. PATENT DOCUMENTS

| | | | |
|---|---|---|---|
| 6,359,678 | B1 | 3/2002 | Ota |
| 7,372,539 | B2 | 5/2008 | Kirchner et al. |
| 7,605,905 | B2 | 10/2009 | Kirchner et al. |
| 9,041,908 | B2 | 5/2015 | Ruoff |
| 9,366,968 | B2 | 6/2016 | Mann |
| 9,568,832 | B2 | 2/2017 | Mann |
| 2004/0263810 | A1 | 12/2004 | Kirchner et al. |
| 2012/0320358 | A1 | 12/2012 | Ruoff |
| 2013/0128251 | A1 | 5/2013 | Mann |
| 2015/0234289 | A1 | 8/2015 | Ruoff |

FOREIGN PATENT DOCUMENTS

| | | |
|---|---|---|
| DE | 10 2004 014 766 | 10/2004 |
| EP | 1 039 510 A1 | 9/2000 |
| WO | WO 2011/120821 A1 | 10/2011 |
| WO | WO 2012/034995 A2 | 3/2012 |

*Primary Examiner* — Colin Kreutzer
(74) *Attorney, Agent, or Firm* — Fish & Richardson P.C.

(57) ABSTRACT

A projection exposure method for exposing a radiation-sensitive substrate with at least one image of a pattern of a mask in a projection exposure apparatus includes using an anamorphic projection lens

20 Claims, 9 Drawing Sheets

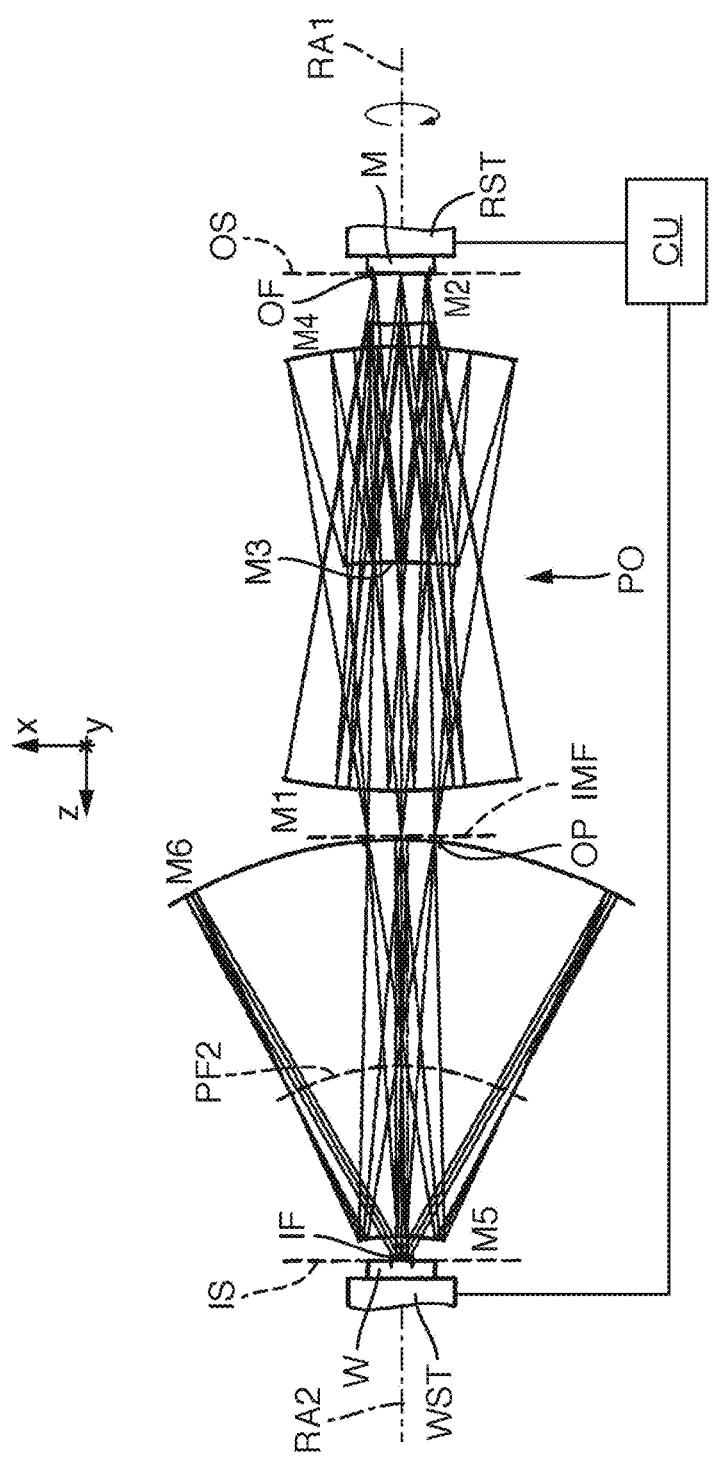

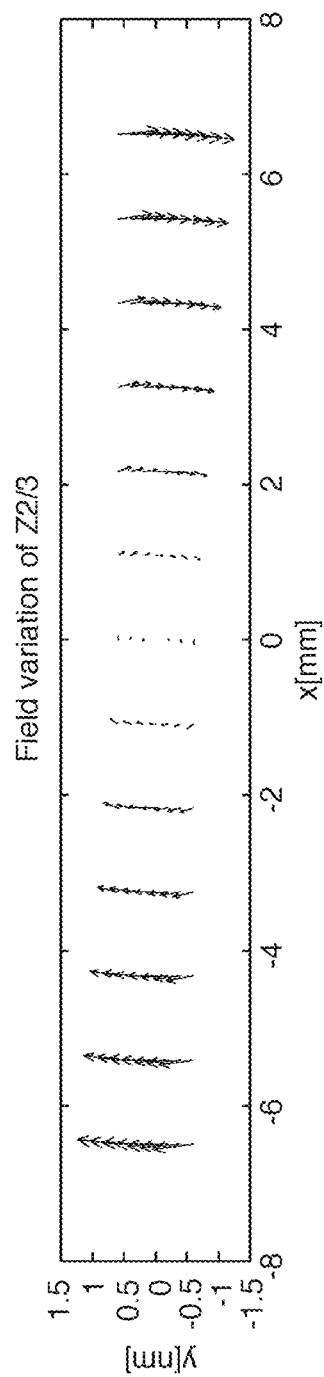
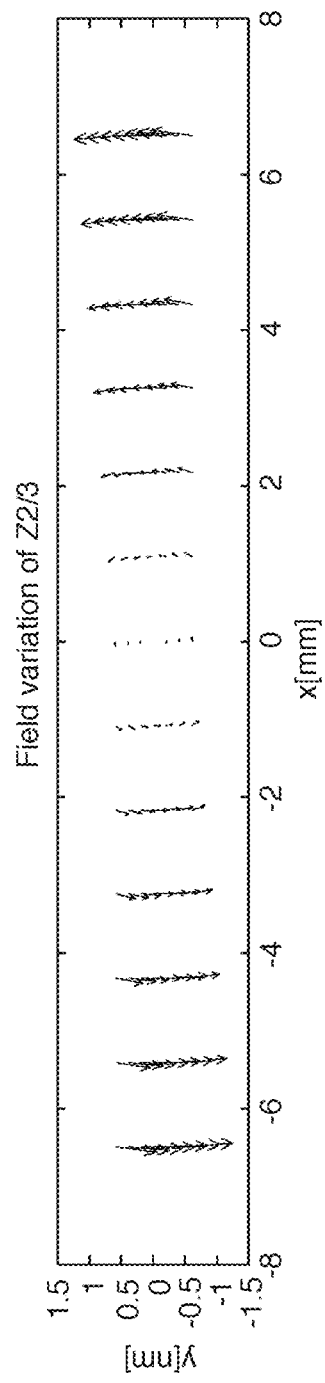

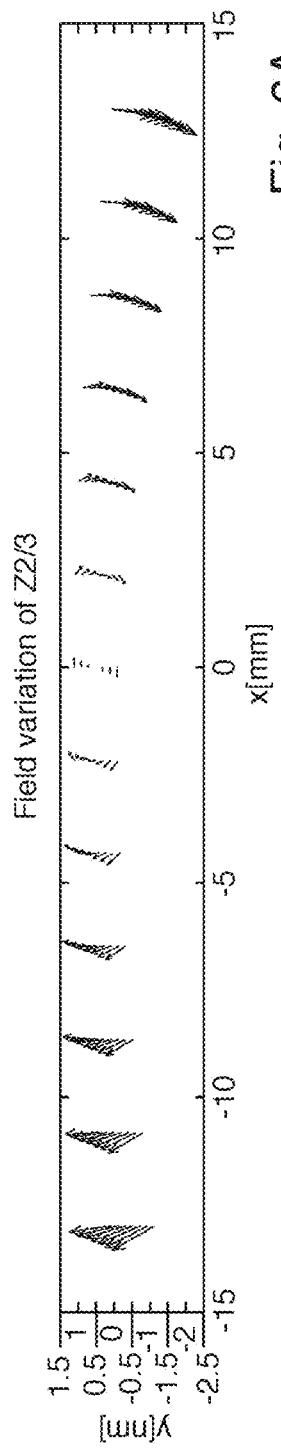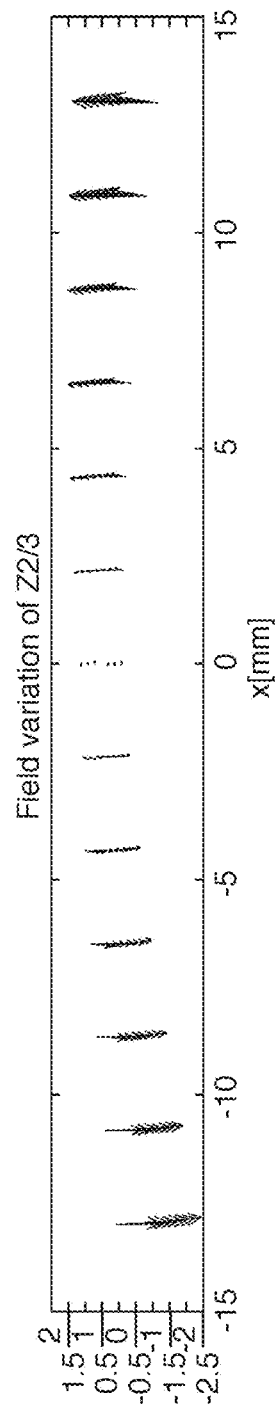

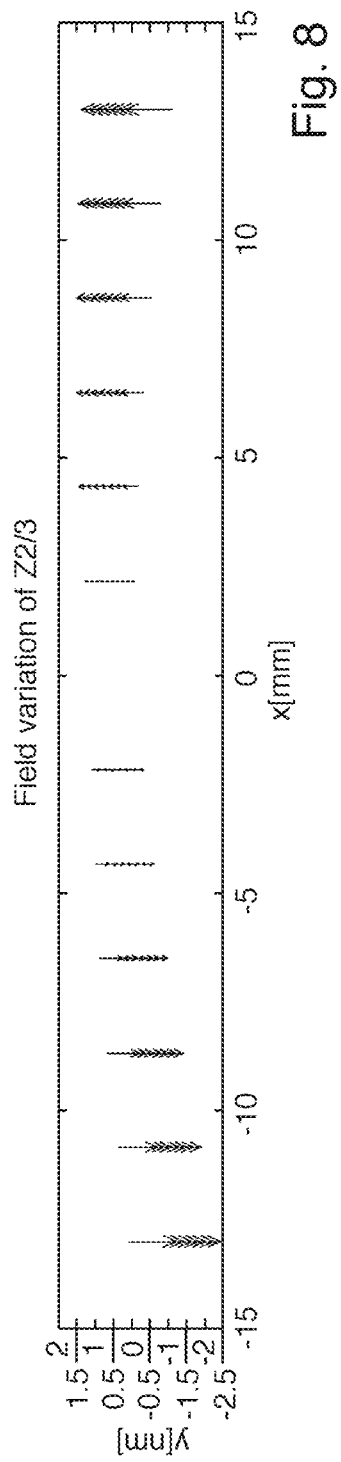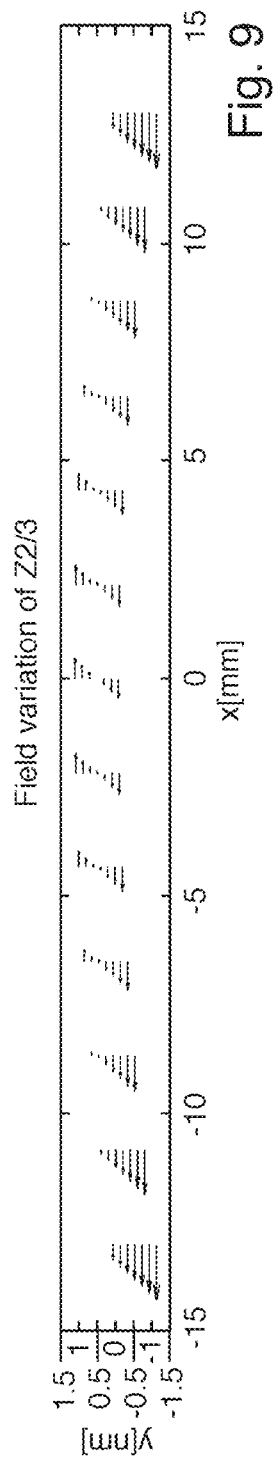

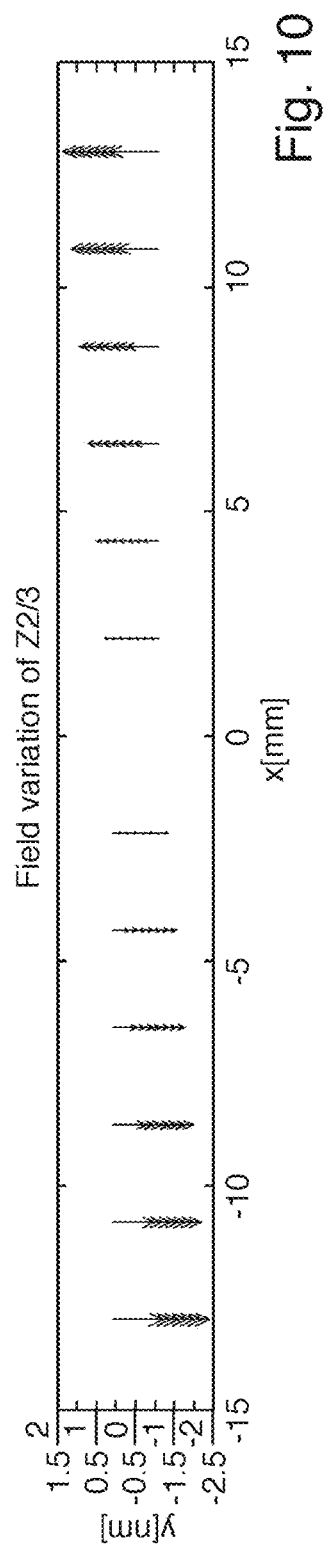

US 9,933,710 B2

PROJECTION EXPOSURE METHOD AND PROJECTION EXPOSURE APPARATUS

CROSS-REFERENCE TO RELATED APPLICATIONS

This application claims priority under 35 U.S.C. § 119 to German Application No. 10 2016 205 617.4, filed Apr. 5, 2016. The contents of this application is hereby incorporated by reference in its entirety.

FIELD

The disclosure relates to a projection exposure method for exposing a radiation-sensitive substrate with at least one image of a pattern of a mask in a projection exposure apparatus with an anamorphic projection lens. Furthermore, the disclosure relates to a projection exposure apparatus configured for carrying out the projection exposure method. One preferred field of application is microlithographic projection exposure via electromagnetic radiation having an operating wavelength λ from the extreme ultraviolet range (EUV).

BACKGROUND

Microlithographic projection exposure methods are predominantly used nowadays for producing semiconductor components and other finely structured components, e.g. masks for microlithography. In this case, use is made of a mask (reticle) that bears the pattern of a structure to be imaged, e.g. a line pattern of a layer of a semiconductor component. The pattern is positioned in a projection exposure apparatus between an illumination system and a projection lens in the region of the object plane of the projection lens and is illuminated with an illumination radiation provided by the illumination system. The radiation changed by the pattern passes as projection radiation through the projection lens, which images the pattern onto the substrate which is to be exposed and is coated with a radiation-sensitive layer and whose surface lies in the image plane of the projection lens, the image plane being optically conjugate with respect to the object plane.

In order to be able to produce ever finer structures, in recent years optical systems have been developed which operate with moderate numerical apertures and obtain high resolution capabilities substantially by the short wavelength of the electromagnetic radiation used from the extreme ultraviolet range (EUV), in particular with operating wavelengths in the range of between 5 nm and 30 nm. In the case of EUV lithography with operating wavelengths around 13.5 nm, for example given image-side numerical apertures of NA=0.3 theoretically a resolution of the order of magnitude of 0.03 µm can be achieved with typical depths of focus of the order of magnitude of approximately 0.15 µm. Radiation from the extreme ultraviolet range cannot be effectively focused or guided with the aid of refractive optical elements, since the short wavelengths are absorbed by the known optical materials that are transparent at longer wavelengths. Therefore, mirror systems are typically used for EUV lithography.

In the field of EUV microlithography, too, endeavours are made to further increase the resolution capability of the systems used by developing projection systems having an ever higher image-side numerical aperture NA, in order to be able to produce ever finer structures. For a given imaging scale, the object-side numerical aperture $NA_O$ thus increases as well.

For higher-aperture EUV systems, narrowband masks pose a challenge because their reflectivity capability decreases greatly at larger angles of incidence of the radiation. Therefore, it has already been proposed to use greater reductions instead of the customary reducing imaging scale of 1:4 ($|\beta|=0.25$) for lithographic-optical systems. By way of example, an imaging scale of 1:8 ($|\beta|=0.125$) instead of 1:4 ($|\beta|=0.25$) halves the object-side numerical aperture $NA_O$ and thus also the angles of incidence of the illumination radiation at the mask by half. However, this imaging scale (for the same mask size) reduces the size of the exposed field and thus the throughput.

It has also already been recognized that when the object-side numerical aperture is increased, the object-side principal ray angle is increased, which can lead to shading effects by the absorber structure of the mask and to problems with the layer transmission. In particular, shading effects can occur owing to the reticle coating (cf. e.g. WO 2011/120821 A1).

WO 2012/034995 A2 proposes for the last-mentioned reason, inter alia, designing an EUV projection lens as an anamorphic projection lens. An anamorphic projection lens is characterized in that a first imaging scale in a first direction deviates from a second imaging scale in a second direction perpendicular to the first direction. The deviation lies significantly outside deviations possibly caused by manufacturing tolerances.

An anamorphic projection lens enables e.g. a complete illumination of an object plane with a large object-side numerical aperture in the first direction, without the extent of the reticle to be imaged in the first direction having to be increased and without the throughput of the projection exposure apparatus being reduced. Furthermore, in comparison with systems having a uniform imaging scale in both directions, a reduction of the losses of imaging quality that are caused by the oblique incidence of the illumination light can also be obtained.

If a 1:8 imaging scale ($|\beta|=0.125$) is set e.g. in the scanning direction, where the field extent is small, while the customary 1:4 imaging scale ($|\beta|=0.25$) acts perpendicularly to the scanning direction (cross-scan direction), then this does not introduce particularly large angles at the mask, but ensures that the field size compared with conventional non-anamorphic projection lenses with $|\beta|=0.25$ in both directions is only halved and not quartered. Moreover, the option arises of achieving full field again with larger reticles.

A projection exposure apparatus generally includes a manipulation system having a multiplicity of manipulators that make it possible to change the imaging properties of the system in a defined manner on the basis of control signals of a control unit. In this case, the term "manipulator" denotes, inter alia, optomechanical devices designed for actively influencing individual optical elements or groups of optical elements on the basis of corresponding control signals in order to change the optical effect of the elements or groups in the projection beam path.

Often, manipulators are also provided in order for example to displace, to tilt and/or to deform the mask and/or the substrate. Generally, manipulators are set in such a way that metrologically detected imaging aberrations can be reduced in a targeted manner. DE 10 2004 014 766 A1 (cf. U.S. Pat. No. 7,372,539 B2) proposes, for the purpose of correcting anamorphism in a projection lens of an EUV projection exposure apparatus, tilting the reticle by a small angle about an axis that is perpendicular to the axis of the projection lens and perpendicular to the scanning direction and in each case runs through the centre of the light field generated on the reticle or the wafer.

EP 1 039 510 A1 proposes adjusting and tilting the reticle in the direction of the optical axis in order to correct aberrations in the imaging scale and the position of the generated image.

SUMMARY

The disclosure provides an approach with which field-dependent image aberrations can be corrected in an anamorphic projection lens.

In one aspect, the disclosure provides a projection exposure method for exposing a radiation-sensitive substrate with at least one image of a pattern of a mask in a projection exposure apparatus with an anamorphic projection lens. The method includes: providing the mask between an illumination system of the projection exposure apparatus and the projection lens in such a way that the pattern is arranged in the region of the object plane of the projection lens; holding the substrate in such a way that a radiation-sensitive surface of the substrate is arranged in the region of an image plane of the projection lens optically conjugate to the object plane; illuminating an illumination region of the mask with an illumination radiation provided by the illumination system; projecting a part of the pattern that lies in the illumination region onto an image field at the substrate with the aid of the projection lens; synchronously moving the mask and the substrate in a respective scanning direction during a scan operation; rotating the mask about a first rotation axis, which is oriented perpendicularly to the object plane, by a first rotation angle; and rotating the substrate in a coordinated manner about a second rotation axis, which is oriented perpendicularly to the image plane, by a second rotation angle. The rotations of the mask and of the substrate are coordinated with one another in such a way that for at least one first image aberration caused by the rotation of the mask a profile over the image field is set and for at least one second image aberration caused by the rotation of the mask a profile over the image field is compensated for by the rotation of the substrate to a greater extent than the profile of the first image aberration over the image field.

In another aspect, the disclosure provides a projection exposure apparatus for exposing a radiation-sensitive substrate with at least one image of a pattern of a mask. The apparatus includes: an illumination system for receiving primary radiation of a primary radiation source and for generating an illumination radiation directed onto the mask; an anamorphic projection lens for generating an image of the pattern in the region of an image plane of the projection lens; a mask holding unit for holding the mask between the illumination system and the projection lens in such a way that the pattern is arranged in the region of an object plane of the projection lens and is movable in a scanning direction perpendicularly to a reference axis of the projection lens; a substrate holding unit for holding the substrate in such a way that a radiation-sensitive surface of the substrate is arranged in the region of the image plane of the projection lens, the image plane being optically conjugate to the object plane, and is movable synchronously with the mask perpendicularly to the reference axis of the projection lens. The mask holding unit as a first rotation unit for the controlled rotation of the mask about a first rotation axis running orthogonally with respect to the object plane. The substrate holding unit has a second rotation unit for the controlled rotation of the substrate about a second rotation axis running orthogonally with respect to the image plane. A control unit of the projection exposure apparatus is configured to rotate the mask holding unit and the substrate holding unit in a manner coordinated with one another in such a way that for at least one first image aberration caused by the rotation of the mask a profile over the image field is set and for at least one second image aberration caused by the rotation of the mask a profile over the image field is compensated for by the rotation of the substrate to a greater extent than the profile of the first image aberration over the image field.

In the method, the mask is rotated or turned about a first rotation axis, which is oriented perpendicularly to the object plane, by a first rotation angle. A rotation of the substrate is coordinated with this rotation of the mask, wherein the substrate is rotated in a coordinated manner about a second rotation axis, which is oriented perpendicularly to the image plane, by a second rotation angle. The rotations of the mask and of the substrate are coordinated with one another in such a way that for at least one first image aberration caused by the rotation of the mask a profile over the image field is set and for at least one second image aberration caused by the rotation of the mask a profile over the image field is compensated for by the rotation of the substrate to a greater extent than the profile of the first image aberration over the image field.

In this procedure, a desired profile of the first image aberration can remain, while by contrast the second image aberration, regarded as parasitic, can be largely or completely compensated for by the coordinated rotation of mask and substrate. The desired manipulation effect in the form of a profile set in a targeted manner for the first image aberration can result overall. The resulting image aberration can be constant over the image field (or constant along the scanning path) or vary depending on the field location (or vary along the scanning path) depending on the method implementation.

This new degree of freedom of the correction of field-dependent image aberrations can be created by coordinated rotation of reticle stage and/or substrate stage, wherein no further manipulators need be present or activated.

The method can be carried out using a projection exposure apparatus in which the mask holding unit has a first rotation unit for the controlled rotation of the mask about a first rotation axis running orthogonally with respect to the object plane, and the substrate holding unit has a second rotation unit for the controlled rotation of the substrate about a second rotation axis running orthogonally with respect to the image plane. The method can be realized by corresponding coordinated driving of the rotation units. For this purpose, the control unit of the projection exposure apparatus can be configured, e.g. with suitable modules of the control program, to rotate the mask holding unit and the substrate holding unit in a manner coordinated with one another in such a way that for at least one first image aberration caused by the rotation of the mask a profile over the image field is set and for at least one second image aberration caused by the rotation of the mask a profile over the image field is compensated for by the rotation of the substrate to a greater extent than the profile of the first image aberration over the image field.

In some method variants it is provided that the mask and the substrate are rotated synchronously or simultaneously about the assigned rotation axes during the scanning operation. Such dynamic rotation during scanning makes it possible to correct aberrations which vary during scanning (or, to put it another way, along the scanning path). Examples thereof are deformations of the mask or of the wafer on account of heating effects or so-called process corrections that may occur in the subsequent processing of the wafer on the part of the end customer. What these aforementioned examples have in common is that they can lead to a different image aberration at any point in time during scanning and the manipulator (here: the coordinated mask and substrate rotation) should therefore be adapted dynamically.

Alternatively, it may be provided that the mask and the substrate are rotated before the beginning of the scan operation, are thereby brought to the desired rotational positions and are then no longer turned or rotated during scanning. It is thus possible to correct aberrations whose extent substantially does not change during scanning (or along the scanning path) or whose extent is independent of the field coordinate (static or scanning-path-independent or field-independent aberrations). In this case, although the rotations have to be coordinated with one another with regard to their rotation angles, a simultaneous rotation is not necessary, even if a synchronous rotation will generally be introduced. Corresponding rotations can also be performed between two successive scan operations.

In some embodiments, a static rotation before the beginning of the scanning process (but also between two scanning processes) and also a dynamic rotation during scanning along a predefined movement profile are possible.

The claimed disclosure is based inter alia on the following considerations. During the operation of modern projection exposure apparatuses designed for scanner operation (lithography scanners), the mask holding unit (the reticle stage) and the substrate holding unit (the substrate stage) is able to be moved highly accurately in a manner synchronized with one another. This presupposes precise movement capabilities and dynamic control capabilities that make the mask holding unit and the substrate holding unit excellent manipulators in principle. By way of example, aberrations can be corrected by targeted deviations from the exactly synchronized profile. For example, if the ratio of the movement speeds deviates from the design scale, scale errors such as may have occurred during mask production, for instance, or arise as a result of element heating can be at least partly compensated for. This correction is possible in a variable manner over the scanning process, that is to say on a timescale of tenths of a second, which is very short for lithography conditions.

The claimed disclosure provides a new possibility of correcting field-dependent image aberrations, if appropriate exclusively by targeted manipulations of the mask holding unit and of the substrate holding unit.

Since the mask holding unit and the substrate holding unit in many modern projection exposure apparatuses are manipulatable highly accurately on a fast timescale anyway (for other reasons), in these apparatuses it is possible for the image aberrations also to be corrected very rapidly, that is to say during the scan operation, as desired with the effect described.

The coordinated, if appropriate simultaneous, rotation of mask holding unit and/or substrate holding unit about a rotation axis that is perpendicular to the mask and/or to the substrate (z-axis), in the case of an anamorphic projection lens, affords a new, fast degree of freedom for correcting specific field profiles which does not occur in non-anamorphic systems. In the latter case (i.e. in the case of a non-anamorphic lens or isomorphic lens), the optical effect of a rotation of the mask about the z-axis is equivalent to the rotation of the substrate by the same absolute value in the opposite direction. Consequently, z-rotations of mask and substrate offer only a single degree of freedom of correction.

In this case, a desired image aberration that is intended to be corrected via a z-rotation of mask and/or substrate is usually superimposed by a disturbing side effect that limits the correction potential.

This situation is different in the case of an anamorphic lens: Although the mask and the substrate generate qualitatively identical image aberrations upon rotation about the z-axis, the resulting displacements of the image points in the image plane (x- and y-directions) differ in terms of absolute value on account of the different imaging scales that are inherent to the anamorphic lens. This enables the setting of a desired image aberration profile for example via z-rotation of the mask and correction or compensation of the undesired side effect via z-rotation of the substrate, without simultaneously compensating for the desired effect.

In many cases it may be expedient to coordinate the rotation angles for mask and substrate (first and second rotation angles, respectively) with one another such that specific ratios result. In an anamorphic projection lens having a first imaging scale in a first direction and a second imaging scale, which deviates from the first imaging scale, in a second direction perpendicular to the first direction, it may be advantageous, for example, if the first and second rotation angles are in a ratio to one another which corresponds to a ratio of the first and second imaging scales or to the reciprocal of this ratio. As a result, it is possible to set specific forms of resulting image aberration profiles, the forms being describable by simple analytical functions, e.g. a pure linear field profile of the image deviation in the scanning direction.

The mask should be moved exclusively in the x-y plane, that is to say parallel to the object plane and without movement components perpendicular thereto, in order to prevent undesired astigmatism aberrations from being generated. There is then no need for further (fast) manipulators to correct a parasitic astigmatism.

BRIEF DESCRIPTION OF THE DRAWINGS

Further advantages and aspects of the disclosure emerge from the claims and the subsequent description of preferred exemplary embodiments of the disclosure, which are explained below on the basis of the figures, in which:

FIG. 3 shows an illustration corresponding to FIG. 2 in a plane perpendicular thereto;

FIG. 4 shows, in FIG. 4A and FIG. 4B, image aberration diagrams for illustrating certain effects on the basis of a reference system (not associated with the claimed disclosure) in the form of an isomorphic projection exposure apparatus with a rectangular field, wherein FIG. 4A shows the field variation of image aberrations Z2 and Z3 in the case of a rotation of the mask by 1 μrad about the z-axis (first rotation axis) and FIG. 4B shows a corresponding diagram for the case of a rotation of the substrate by 1 μrad about the second rotation axis (z-axis);

FIG. 6 shows, in FIG. 6A and FIG. 6B, image aberration diagrams which correspond to the diagrams in FIGS. 5A and 5B, but for the case of an exemplary embodiment of an anamorphic projection lens with a ring field, wherein FIG. 6A shows the resulting field variation of Z2 and Z3 in the case of a rotation of the mask by 1 μrad about the z-axis and FIG. 6B shows a corresponding image aberration diagram of the field variation of Z2 and Z3 in the case of a rotation of the substrate by 1 μrad about the z-axis;

FIG. 8 shows an image aberration diagram for the case of a rotation of the mask by 1 μrad and of the substrate by 2 μrad, in each case about the associated rotation axis (z-axis) in an exemplary embodiment of an anamorphic projection lens with a ring field;

FIG. 9 shows an image aberration diagram for the case of a rotation of the mask by 2 μrad and of the substrate by 1 μrad, in each case about the associated rotation axis (z-axis) in an exemplary embodiment of an anamorphic projection lens with a ring field;

FIG. 10 shows an image aberration diagram for the case of a rotation of the mask by 1 μrad and of the substrate by 2 μrad, in each case about the associated rotation axis (z-axis) in an exemplary embodiment of an anamorphic projection lens with a rectangular field; and FIG. 11 shows an image aberration diagram for the case of a rotation of the mask by 2 μrad and of the substrate by 1 μrad, in each case about the associated rotation axis (z-axis) in an exemplary embodiment of an anamorphic projection lens with a rectangular field.

DETAILED DESCRIPTION OF THE EXEMPLARY EMBODIMENTS

Figure 1:
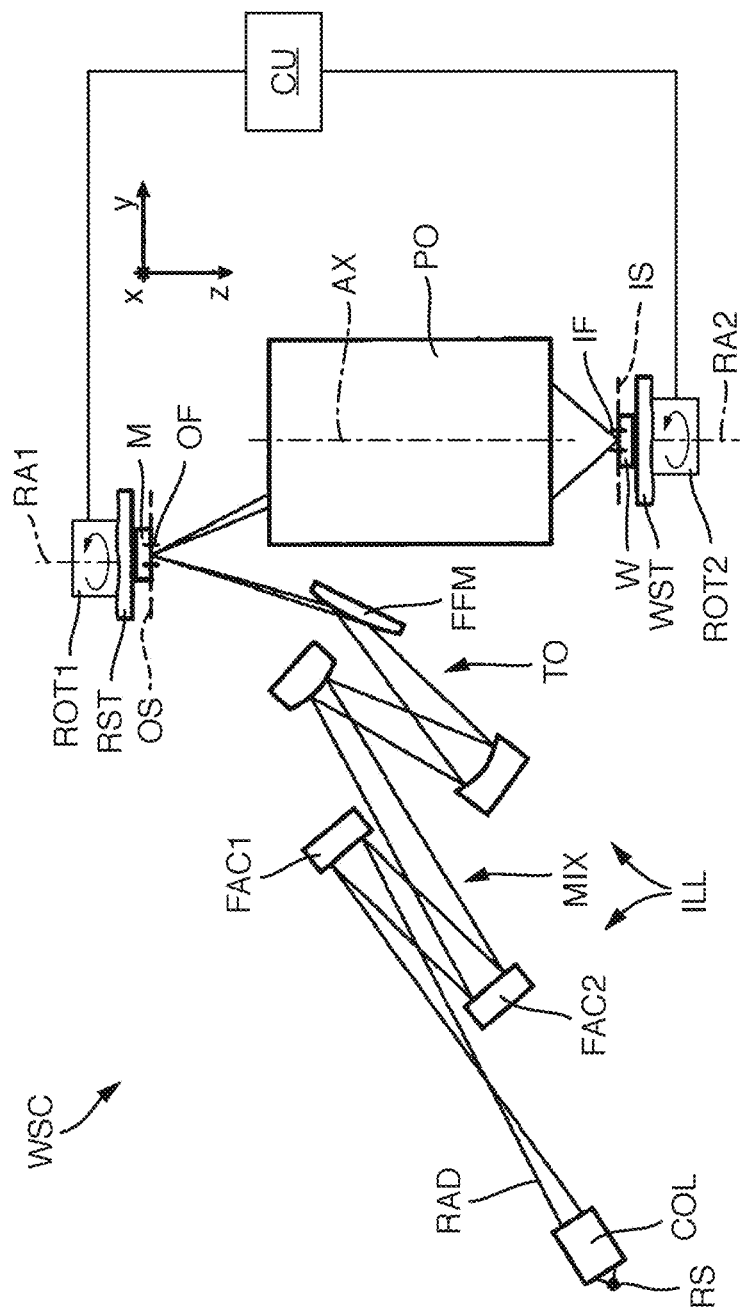
FIG. 1 schematically shows a section through a projection exposure apparatus for EUV microlithography.

FIG. 1 shows by way of example optical components of an EUV microlithography projection exposure apparatus WSC in accordance with one embodiment of the disclosure. The EUV microlithography projection exposure apparatus serves for exposing a radiation-sensitive substrate W, which is arranged in the region of an image plane IS of a projection lens PO, with at least one image of a pattern of a reflective mask M, the pattern being arranged in the region of an object plane OS of the projection lens. The mask M is also designated here alternatively as reticle M. In the case of the example, the substrate is a wafer composed of semiconductor material that is coated with a light-sensitive resist layer.

To facilitate understanding of the description, a Cartesian xyz-coordinate system is indicated, which reveals the respective positional relationship of the components illustrated in the figures. The projection exposure apparatus WSC is of the scanner type. The x-axis runs perpendicularly to the plane of the drawing into the latter in FIG. 1. The y-axis runs towards the right. The z-axis runs downwards. The object plane OS and the image plane IS both run parallel to the x-y-plane. During the operation of the projection exposure apparatus, the mask M and the substrate are moved synchronously or simultaneously during a scan operation in the y-direction (scanning direction) and thereby scanned. The apparatus is operated with the radiation from a primary radiation source RS. An illumination system ILL serves for receiving the radiation from the primary radiation source and for shaping illumination radiation directed onto the pattern. The projection lens PO serves for imaging the pattern onto the light-sensitive substrate.

The primary radiation source RS may be, inter alia, a laser plasma source or a gas discharge source or a synchrotron-based radiation source. Such radiation sources generate a radiation RAD in the EUV range, in particular having wavelengths of between 5 nm and 15 nm. The illumination system and the projection lens are constructed with components that are reflective to EUV radiation in order that they operate in this wavelength range. The radiation RAD emerging from the radiation source RS is collected with a collector COL and guided into the illumination system ILL. The illumination system includes a mixing unit MIX, a telescope optical unit TO and a field forming mirror FFM. The illumination system shapes the radiation and thereby illuminates an illumination field situated in the object plane OS of the projection lens PO or in the vicinity thereof. In this case, the shape and size of the illumination field determine the shape and size of the effectively used object field OF in the object plane OS.

During the operation of the apparatus, the reflective reticle M is arranged in the region of the object plane OS.

The mixing unit MIX substantially consists of two facet mirrors FAC1, FAC2. The first facet mirror FAC1 is arranged in a plane of the illumination system which is optically conjugate with respect to the object plane OS. Therefore, it is also designated as a field facet mirror. The second facet mirror FAC2 is arranged in a pupil plane of the illumination system that is optically conjugate with respect to a pupil plane of the projection lens. Therefore, it is also designated as a pupil facet mirror.

With the aid of the pupil facet mirror FAC2 and the imaging optical assembly disposed downstream in the beam path and including the telescope optical unit TO and the field forming mirror FFM operated with grazing incidence, the individual mirroring facets (individual mirrors) of the first facet mirror FAC1 are imaged into the object field.

The spatial (local) illumination intensity distribution at the field facet mirror FAC1 determines the local illumination intensity distribution in the object field. The spatial (local) illumination intensity distribution at the pupil facet mirror FAC2 determines the illumination angle intensity distribution in the object field OF.

Figure 2:
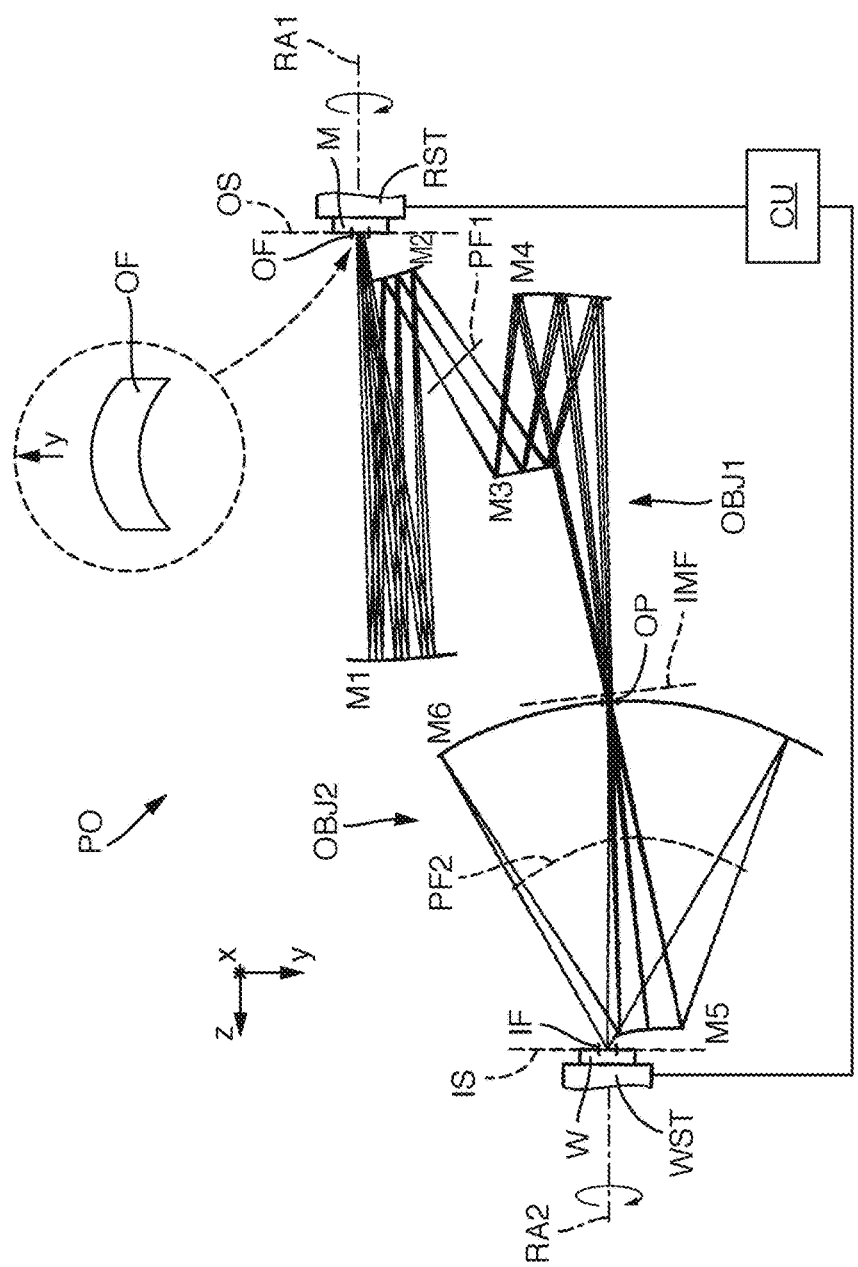
FIG. 2 schematically shows an excerpt from the projection exposure apparatus in accordance with FIG. 1 for illustrating the beam path in an anamorphic projection lens in accordance with one exemplary embodiment.

The effective object field OF is a rectangular field in the exemplary embodiment in FIGS. 2 and 3, but in other variants can also be a curved field (ring field RF, see detail in FIG. 2).

A mask holding unit RST for holding and manipulating the mask M (reticle) is arranged such that the pattern arranged on the mask lies in the object plane OS of the projection lens PO, the object plane here also being designated as the reticle plane. The mask is movable in this plane for scanner operation in a scanning direction (y-direction) perpendicularly to the reference axis AX of the projection lens (z-direction) with the aid of a scan drive. The mask holding unit RST is also designated here as reticle stage.

The mask holding unit RST has a first rotation unit ROT1 for the controlled rotation of the mask about a first rotation axis RA1, which runs parallel to the z-direction and perpendicular to the scanning direction and to the x-direction). The first rotation axis RA1 runs through the centre of a rectangle which circumscribes the effective object field OF in the object plane. The mask holding unit RST can furthermore contain a tilting unit in order to tilt the mask as desired from the position parallel to the object plane about a tilting axis running parallel to the x-direction and/or about a tilting axis running parallel to the y-direction. These units are dynamically usable during scanning, inter alia, in particular in such a way that a tilting and/or rotation of the mask can be effected in a time interval between the beginning and end of a scan operation proceeding in one direction according to a predefinable movement profile. The units can also be actuated before and/or after a scan operation.

The substrate W to be exposed is held by a substrate holding unit WST including a scanner drive in order to move the substrate synchronously with the mask M perpendicularly to the reference axis AX in a scanning direction (y-direction). Depending on the design of the projection lens PO, these movements of mask and substrate can be carried out parallel or antiparallel to one another. The substrate holding unit WST is also designated here as substrate stage (or wafer stage).

The substrate holding unit WST has a second rotation unit ROT2 for the controlled rotation of the substrate about a second rotation axis RA2 running parallel to the z-direction and perpendicular to the scanning direction and to the x-direction. The second rotation axis RA2 runs through the centre of a rectangle which circumscribes the effective image field IF in the image plane. The substrate holding unit WST can furthermore contain a tilting unit in order to tilt the wafer or the substrate as desired from the position parallel to the image plane about a tilting axis running parallel to the x-direction and/or about a tilting axis running parallel to the y-direction. These units are dynamically usable during scanning, inter alia, in particular in such a way that a displacement of the substrate can be carried out in a time interval between the beginning and end of a scan operation proceeding in one direction according to a predefinable movement profile. The units can also be actuated before and/or after a scan operation.

The substrate holding unit WST and also the mask holding unit RST are part of a scanner unit controlled via a scan control unit, which in the case of the embodiment is integrated into the central control unit CU of the projection exposure apparatus.

The illumination system ILL has an exit pupil, the shape of which is adapted to the shape of an entrance pupil of the projection lens PO and in particular corresponds precisely to the latter. The exit pupil of the illumination system ILL is embodied in an elliptic fashion. This can be achieved in particular using an elliptically embodied pupil facet mirror FAC2. As an alternative thereto, the pupil facets can also be arranged on the pupil facet mirror FAC2 in such a way that they have an elliptically embodied envelope.

The semiaxes of the elliptic pupil facet mirror FAC2 can have two different semiaxis lengths, wherein the larger (second) semiaxis length is e.g. at least one and a half times, possibly even at least double, the magnitude of the first semiaxis length. The semiaxes of the exit pupil of the illumination system ILL can correspondingly likewise have different semiaxis lengths, preferably with the same semiaxis length ratios.

For traditional rotationally symmetrical systems having a non-anamorphic imaging scale, the principal rays of the illumination beams should meet in the entrance pupil plane of the projection lens in order to ensure a field-constant optimum illumination. For VUV systems (systems which operate with operating wavelengths from the vacuum ultraviolet range), the entrance pupil is typically at infinity; therefore, these systems are telecentric, i.e. the principal rays impinge on the reticle perpendicularly. In the case of EUV systems, the reflective reticle has to be illuminated obliquely in order to separate the illumination beam path and the projection beam path. Therefore, the entrance pupil should be situated at a finite distance from the reticle. A distance in the range of 1 to 3 m is considered to be advantageous here.

This results in a variation of the principal ray angle at the reticle, to a first approximation a linear profile which corresponds to a linear telecentricity profile in the x-direction and which thus generates a linear image deviation in the x-direction (perpendicular to the scanning direction) upon a z-shift of the reticle.

The projection lens PO serves for the reducing imaging of the pattern arranged in the object plane OS of the projection lens into the image plane IS, which is optically conjugate with respect to the object plane and which, in the example, lies parallel to the object plane, but can also be oriented differently in other variants. This imaging is effected via electromagnetic radiation from the extreme ultraviolet range (EUV) around an operating wavelength λ, which in the case of the example is 13.5 nm. The object field OF is imaged into an image field IF that is conjugate with respect to the object field in this case.

An anamorphic projection lens is involved. The anamorphic projection lens is no longer rotationally symmetrical, but rather designed as a freeform surface design. Therefore, it is not necessary for there to be a single entrance pupil position, rather the x- and y-directions can be decoupled from one another and lie in different planes. This is then referred to as an astigmatic entrance pupil. Therefore, the illumination system can likewise be equipped with an astigmatic, i.e. non-homocentric imaging which is adapted to the astigmatic entrance pupil of the projection lens.

FIGS. 2 and 3 show in different views the optical design of a first embodiment of an anamorphic projection lens PO. The illustration shows the beam path of individual rays of the radiation which proceed from a central object field point and from two object field points respectively defining the two opposite margins of the object field OF.

The projection lens PO in accordance with FIG. 2 and FIG. 3 has a total of six mirrors, which are numbered consecutively by M1 (first mirror) to M6 (sixth mirror) in the direction of the beam path, proceeding from the object field OF. FIGS. 2 and 3 illustrate the reflection surfaces of the mirrors M1 to M6 as calculated during the design of the projection lens PO. As evident from the figures, in part only a segment of the surfaces illustrated is actually used for reflecting the radiation. The actual embodiment of the mirrors M1 to M6 can thus be smaller than is illustrated in the figures, in particular can include only a part of the calculated reflection surface illustrated in the figures.

A first pupil surface PF1, which can be plane or curved, is situated between the second mirror M2 and the third mirror M3. Moreover, an intermediate image surface IMF is situated between the fourth mirror M4 and the fifth mirror M5. The intermediate image surface IMF can be plane or curved. The mirrors M1 to M4 thus form a first (imaging) partial lens OBJ1. The mirrors M5 and M6 form a second imaging partial lens OBJ2.

The sixth mirror M6 has a through opening OP for passage of the radiation. A further pupil surface PF2 is situated between the mirrors M5 and M6. The pupil surface PF2 can be plane or curved.

The projection lens does not have a "traditional" optical axis common to all the mirrors. A reference axis AX (see FIG. 1) runs perpendicularly to the object plane and the image plane parallel thereto. The optical system has a mirror symmetry with respect to the y-z-plane illustrated in FIG. 3.

The first partial lens OBJ1 is an anamorphic lens, i.e. it images anamorphically. The second partial lens OBJ2 is likewise an anamorphic lens, i.e. it images anamorphically. However, it is likewise possible for the second partial lens OBJ2 to be embodied as non-anamorphic.

An anamorphic system having freeform surfaces is involved. In the case of a mirror having a freeform surface, the mirror surface has different radii of curvature in the x- and y-directions, that is to say is astigmatic. The overall effect here is such that a system or sub-system images anamorphically. The projection lens PO can include a plurality of astigmatically imaging mirrors, e.g. two, three, four, five or six.

The projection lens PO thus has a first imaging scale $\beta_1$ in a first direction and a second imaging scale $\beta_2$, different therefrom, in a second direction. The second imaging scale can be e.g. at least one and a half times the magnitude of the first imaging scale, in particular at least double the magnitude thereof. The factor can be e.g. in the range of 1.4 to 2. The projection lens PO is embodied in such a way that the absolute value of the imaging scale in the scanning direction (y-direction) is less than the absolute value of the imaging scale perpendicular thereto. Therefore, the system has a more greatly reducing effect in the scanning direction than in the cross-scan direction (x-direction). The absolute value of the imaging scale in the scanning direction can be e.g. at most three quarters, in particular at most two thirds, in particular at most half, the magnitude of that perpendicular thereto. By way of example, the imaging scale can be ¼ in the x-direction and ⅛ in the y-direction.

The projection lens PO has a direction-dependent object-side numerical aperture ($NA_O$), i.e. the entrance pupil deviates from the circular shape. In this case, the object-side numerical aperture ($NA_O$) in a specific direction, namely in the direction of the large imaging scale, is e.g. at least one and a half times the magnitude of that in the direction perpendicular thereto.

The mirrors M1 to M6 are embodied as reflective to EUV radiation. They bear in particular multiple reflection layers for optimizing their reflection for the incident EUV illumination light (multilayer mirror). The reflection can be optimized all the better, the closer the angle of incidence of the individual rays on the mirror surfaces is to normal incidence. The mirrors M1 to M5 have reflection surfaces embodied in a closed fashion, that is to say without a through opening. The mirrors M1, M4 and M6 have concave reflection surfaces. The mirrors M2, M3 and M5 have convex reflection surfaces.

The mirrors M1 to M6 of the projection lens PO or their reflection surfaces are embodied as freeform surfaces that are not describable by a rotationally symmetrical function. Such a freeform surface can be generated from a rotationally symmetrical reference surface. Freeform surfaces for reflection surfaces of the mirrors of projection lenses of projection exposure apparatuses for microlithography are known e.g. from US 2007-0058269 A1. A freeform surface can be described mathematically by the following equation:

$$Z(x, y) = \frac{cr^2}{1 + \sqrt{1 - (1+k)c^2 r^2}} + \sum_{j=2}^{N} \frac{C_j}{N_{radius}^{m+n}} x^m y^n$$

wherein it holds true that:

$$j = \frac{(m+n)^2 + m + 3n}{2} + 1$$

Z is the sagittal height of the freeform surface at the point x, y, where $x^2+y^2=r^2$. Parameter c is a constant corresponding to the vertex curvature of a corresponding asphere. k corresponds to a conic constant of a corresponding asphere. $C_j$ are the coefficients of the monomials $x^m$, $y^n$. The values of c, k and C are typically determined on the basis of the desired optical properties of the mirror within the projection lens PO. $N^{m+n}_{radius}$ is a normalization factor for the coefficients $C_j$. The order of the monomial, m+n, can be varied arbitrarily. A higher-order monomial can lead to a design of the projection lens with better image aberration correction, but is more complex to calculate. m+n can assume values of between 3 and more than 20.

The tables indicated at the end of the description summarize optical design data of the projection lens PO in tabular form, which data were obtained with the aid of the optical design program Code V®. Table 1 specifies, with respect to the optical surfaces of the optical components and with respect to the aperture stop, in each case the reciprocal of the vertex curvature (Radius) and a distance value (Thickness) corresponding to the z-distance between adjacent elements in the beam path, proceeding from the image plane IS, that is to say counter to the light direction.

Table 2 specifies the coefficients $C_j$ of the monomials $x^{mn}$ in the above-specified freeform surface equation for the mirrors M1 to M6. Table 3 specifies the absolute value in mm along which the respective mirror, proceeding from a mirror reference design, was decentred (Y-decentre) and rotated (X-rotation). This corresponds to a parallel shift and a tilting in the case of the freeform surface design method. In this case, shifting is effected in the y-direction and tilting is effected about the x-axis. In this case, the angle of rotation is specified in degrees.

The second mirror M2 is curved to different extents in the X-direction and Y-direction. This is evident from the fact that the quadratic coefficients X2 and Y2 in Table 1 have distinctly different orders of magnitude (difference approximately a factor of 20). That contributes to the fact that the first partial lens OBJ1 (and also the entire projection lens) images anamorphically.

This basic design of the projection lens corresponds to the projection lens in FIGS. 2 and 3 in WO 2012/034995 A2. Other projection lenses described in the application can likewise be used in the context of the present disclosure. The disclosure content of the document WO 2012/034995 A2 in its entirety is incorporated in the content of this description.

The projection exposure apparatus in the exemplary embodiment includes a manipulation system having numerous manipulators which make it possible to change the imaging properties of the projection lens and, if appropriate, the imaging-influencing properties of other components in a defined manner on the basis of control signals of the control unit CU. In this case, the term "manipulator" denotes a device which is designed for changing its optical effect in a targeted manner on the basis of corresponding control signals of a control. In general, manipulators are set in such a way that metrologically detected image aberrations can be reduced in a targeted manner.

During the operation of the projection exposure apparatus, e.g. the mask holding unit RST (the reticle stage) and the substrate holding unit WST (the substrate stage) have to be moved highly accurately in a manner synchronized with one another. For this purpose, there are precise movement capabilities and dynamic control capabilities which make the mask holding unit RST and the substrate holding unit WST excellent manipulators. Aberrations can be corrected by targeted deviations from the exactly synchronized profile. By way of example, if the ratio of the movement speeds (speeds of movement in the respective scanning direction) of reticle and substrate deviates from the design scale, then scale errors such as may have occurred during mask production, for instance, or arise as a result of element heating can be compensated for. This correction is possible in a variable manner over the scanning process, that is to say on a timescale of tenths of a second, which is very short for lithography conditions.

Especially in combination with ring fields and the oblique incidence of light on the EUV reticle for the purpose of disentangling illumination beam path and projection lens, tilts of reticle stage and/or substrate stage can set quadratic field profiles of Z2, Z3 and Z4. The abbreviations Z2, Z3, etc. here stand generally for Zernike coefficients that describe specific aberrations relevant to the imaging. In this case, Z2 stands for an image deviation in the x-direction (perpendicular to the scanning direction), Z3 represents the image deviation in the y-direction (scanning direction), and Z4 represents the defocus. In this context, the term "image deviation" denotes how far and in what direction an actual position of an image point is situated away or at a distance from the associated setpoint position of the image point in the case of ideal imaging. The image deviation can alternatively also be referred to as "image point shift".

Special features and advantages of exemplary embodiments are explained below in comparison with reference examples on the basis of schematic image aberration diagrams. The image aberration diagrams graphically represent the results of different correction scenarios determined by simulation. In this case, each image aberration diagram graphically represents distortion-like image aberrations in the region of the image field (in the image plane of the projection lens) for a multiplicity of field points with the aid of arrows. The base point of each arrow lies for each arrow at that location at which an image point would lie in the case of ideal imaging (without image aberrations), that is to say at the setpoint position of the image point. The tip of each arrow lies at that location at which the actual image point lies in the case of an imaging beset by image aberrations, that is to say at the actual position of the image point. The length of the arrow indicates the extent of the discrepancy between setpoint position and actual position of the image point; the arrow direction corresponds to the direction of the discrepancy. The arrows thus represent the image deviation or image point shift.

In the image aberration diagrams, the y-direction corresponds to the scanning direction of the projection exposure apparatus; the x-direction perpendicular thereto corresponds to the cross-scan direction. On the basis of the image aberration diagrams for a multiplicity of field points, the variation of the respective image aberrations over the field (in the x-direction) is also readily discernible. This variation over the field is also designated here as "field profile". In the case of a quantification of a field profile, the latter can be decomposed into a constant portion, a linear portion and a quadratic portion of the profile. In the notation in this application, by way of example, abbreviation $Z2\_0$ stands for the constant portion, $Z2\_1$ stands for the linear portion and $Z\_2$ stands for the quadratic portion of the profile of the Z2 aberration averaged in the scanning direction (distortion in the x-direction). The profile in the x-direction can thus be described e.g. by $Z2(x)=Z2\_0+Z2\_1*P_1(x)+Z2\_2*P_2(x)+\ldots$, wherein $P_n(x)$ is the n-th Legendre polynomial. In order to illustrate certain effects, with reference to FIGS. 4A and 4B firstly a description is given of the conditions in a reference system REF (not associated with the claimed disclosure) in the form of an isomorphic projection lens, that is to say a projection lens of conventional design having an identical imaging scale in the x-direction and y-direction.

The projection lens (the isomorphic lens) is designed for a rectangular field. FIG. 4A shows the field variation of Z2 and Z3 in the case of a rotation of the mask (of the reticle) by 1 μrad about the z-axis (first rotation axis). FIG. 4B shows a corresponding diagram for the case of a rotation of the substrate by 1 μrad about the second rotation axis (z-axis). It is evident that the optical effect of a rotation of the mask about the z-axis is equivalent to a rotation of the substrate by the same absolute value in the opposite direction. The principal effect that arises is a field dependence of Z3, i.e. of the image deviation in the y-direction (scanning direction), which to a first approximation increases linearly with the distance from the field centre ($Z3 \rightarrow Z3\_1$). Consequently, a z-rotation of the mask and a z-rotation of the substrate would afford in each case only a single degree of freedom of correction. The correction potential of a rotation of mask and/or substrate would accordingly be limited because although a particularly disturbing image aberration could be compensated for using the z-rotation of mask and/or substrate, at the same time a non-compensatable disturbing side effect would also remain. By way of example, a field-constant Z2 fading can remain (i.e. Z2 changes over the image field along the y-direction). However, the "fading" is constant along the x-direction. This is evident from FIGS. 4A and 4B.

Figure 5A:
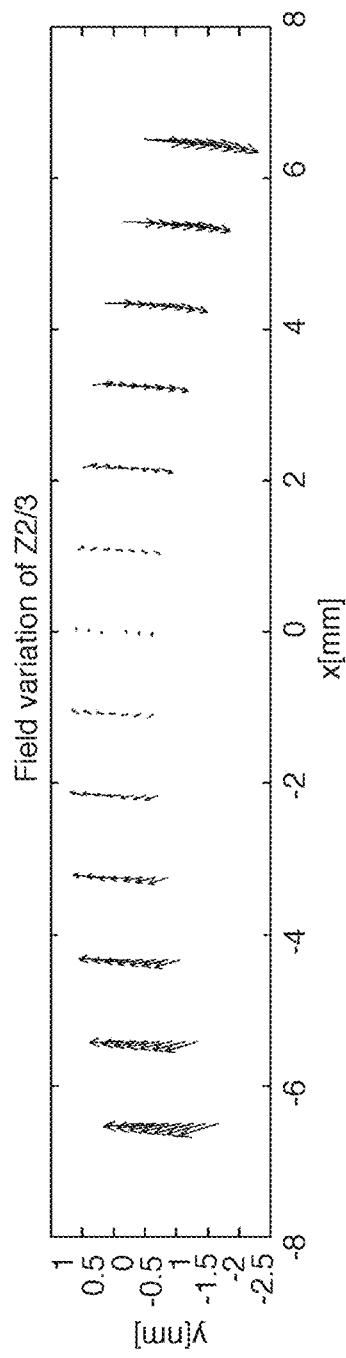
FIG. 5 shows, in FIG. 5A and FIG. 5B, the results of corresponding rotations of mask and substrate in the case of an isomorphic lens (not associated with the claimed disclosure) with an arcuately curved ring field.
Figure 5B:
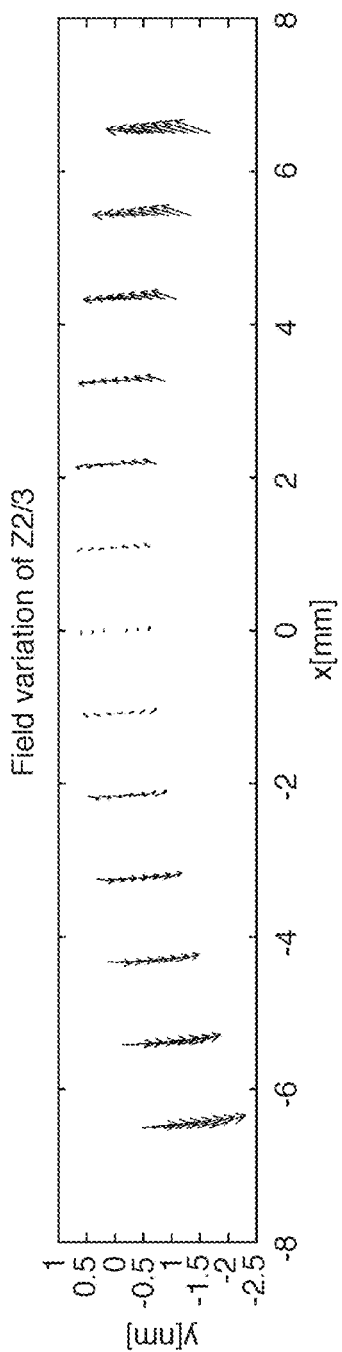

FIGS. 5A and 5B show the results of corresponding rotations of mask and substrate in the case of an isomorphic lens with an arcuately curved ring field. In this case, FIG. 5A once again shows the field variation of Z2 and Z3 which arises as a result of a rotation of the mask by 1 μrad about the z-axis. FIG. 5B shows the corresponding conditions in the case of a rotation of the substrate by 1 μrad about the z-axis. It is evident that, in addition to the dominant effect of a field-dependent Z3, a quadratic profile of Z2 (scan-averaged, $Z2\_2$) also results on account of the ring field geometry.

In the case of an isomorphic lens, the effect of a rotation of the mask can be practically completely compensated for by a corresponding rotation of the substrate.

The conditions in the case of an anamorphic projection lens are different in principle. It is true that here, too, a rotation of the mask and a rotation of the substrate about their respective rotation axes generate qualitatively identical image aberrations. However, the resulting shifts of the image points in the x- and y-directions (represented by the arrows) differ in terms of absolute value on account of the different imaging scales in the x- and y-directions. This enables for example the setting of a desired image aberration profile via z-rotation of the mask and a correction of the undesired side effect likewise generated here via a z-rotation of the substrate, wherein, as a result, the actually desired effect on the other image aberration is not compensated for or is compensated for only to a significantly smaller extent, such that an effective correction of the abovementioned image aberration (target image aberration) can be achieved via a combined rotation of mask and substrate by suitable rotation angles.

Figure 7:
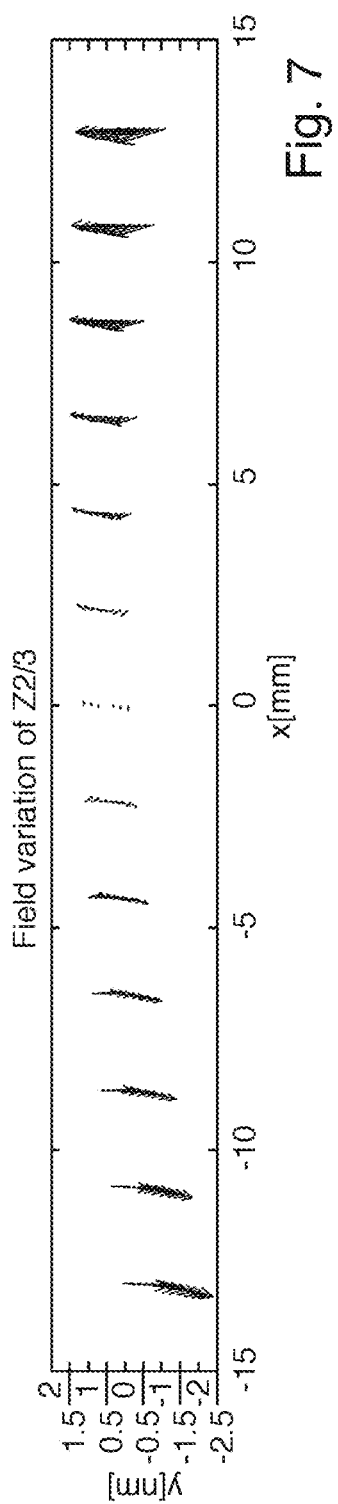
FIG. 7 shows an image aberration diagram of the field variation of Z2 and Z3 for the case of a rotation of the mask and of the substrate by in each case 1 μrad about the z-axis.

For illustration purposes, FIGS. 6A and 6B show image aberration diagrams corresponding to the diagrams in FIGS. 5A and 5B, but here for the case of an exemplary embodiment of an anamorphic projection lens with a ring field. In this case, FIG. 6A shows the resulting field variation of Z2 and Z3 in the case of a rotation of the mask by 1 μrad about the z-axis; FIG. 6B shows a corresponding image aberration diagram of the field variation of Z2 and Z3 in the case of a rotation of the substrate by 1 μrad about the z-axis. It is evident that the resulting image aberrations and their field profiles differ in extent and direction. This becomes quantitatively evident from FIG. 7, which shows an image aberration diagram of the field variation of Z2 and Z3 for the case of a rotation of the mask and of the substrate by in each case 1 μrad about the z-axis. In the case of an anamorphic lens, no compensation of the quadratic portion of Z2 (Z2_2) and of the linear portion of Z3 (Z3_1) is evidently carried out. These image aberration portions can thus be generated or compensated for by simultaneous rotation of mask and substrate by suitable rotation angles.

For further illustration, FIGS. 10 and 11 show different possibilities of the generation or compensation of image aberrations in the case of an anamorphic projection lens with a rectangular field. FIG. 10 here shows a resulting image aberration diagram for the case of a rotation of the mask by 1 μrad and of the substrate by 2 μrad, in each case about the associated rotation axis (z-axis). As the resulting image aberration, all that remains here is a linear variation of the image deviation in the y-direction over the field (Z3_1) without Z2 fading.

FIG. 11 shows an image aberration diagram for the case of the rotation of the mask by 2 μrad and of the substrate by 1 μrad, in each case about the associated rotation axis (z-axis). In this case, the image deviation in the x-direction (Z2) is independent of the x-coordinate and vanishes in a scan-averaged manner, i.e. in the case of a scanning imaging. In this exemplary embodiment with a rectangular exposure field, a rotation of the mask or of the substrate about the z-axis thus produces a linear Z3 profile and field-constant Z2 fading. In this case, the term "Z2 fading" denotes a linear Z2 profile in the y-direction with constant conditions in the x-direction. If the mask and the substrate are rotated simultaneously by suitable rotation angles about the z-axis, then arbitrary combinations of these two image aberrations can be set.

In particular, the z-rotations of mask and substrate may thus constitute a fast, ideal manipulator for linear Z3 profiles and/or for constant Z2 fading with a linear Z2 profile in the y-direction. In this context, the term "fast" means that the image aberrations or the compensation thereof can be set during a scan operation via corresponding control of the rotation of mask and/or substrate. In this context, the term "ideal" means that no residual aberrations or side effects are generated besides the desired image aberrations. Linear Z3 profiles may occur for example as a consequence of heating and/or mounting effects of mask or substrate. Z2 fading may occur inter alia as a disturbing side effect during focus drilling if a telecentricity error is simultaneously present. Focus drilling is a method known per se which makes it possible to achieve an effective increase in the depth of focus by inclination or tilting of the substrate.

Exemplary correction possibilities in the case of an anamorphic projection lens with a ring field will be described with reference to FIGS. 8 and 9. FIG. 8 here shows an image aberration diagram for the case of a rotation of the mask by 1 μrad and of the substrate by 2 μrad, in each case about the corresponding rotation axis (z-axis). As the resulting image aberration, all that remains is a linear field profile of Z3 (Z3_1), while no quadratic field profile of Z2 results.

FIG. 9 shows an image aberration diagram for the case of a rotation of the mask by 2 μrad and of the substrate by 1 μrad, in each case about the corresponding rotation axis (z-axis). In this case, all that results is a quadratic portion of the field profile of Z2 (Z2_2) and Z2 fading, while no linear portion of Z3 results. A selective compensation of Z2_2 or of Z3_1 is thus possible.

In this exemplary embodiment with a ring field, in addition to the abovementioned image aberrations in the case of the z-rotation of mask and/or substrate, a quadratic Z2 profile (Z2_2) is generated, which always occurs simultaneously with Z2 fading. This effect can thus be used as a manipulator for a quadratic Z2 profile via the mask and the substrate being rotated in each case such that the linear Z3 profile is precisely compensated for (cf. FIG. 11). As a residual aberration, constant Z2 fading thus remains, which limits the correction potential for the quadratic Z2. Quadratic Z2 profiles occur for example as a consequence of mask writing errors or as a result of substrate unevennesses in conjunction with a telecentricity error and should be able to be dynamically corrected during operation. As also in the case of a rectangular field, a linear Z3 profile can be corrected exactly and without residual aberrations (cf. FIG. 8).

The simulations were calculated for an exemplary embodiment of a projection lens having an imaging scale of ¼ in the x-direction and an imaging scale of ⅛ in the y-direction. Deviations therefrom are possible; they generally lead to qualitatively similar conditions, but quantitatively different values of resulting image aberrations.

Some aspects of exemplary embodiments of the disclosure have been explained on the basis of a projection exposure apparatus for EUV microlithography. The application of the disclosure is not restricted to this wavelength range. By way of example, projection lenses and projection exposure apparatuses for microlithography using radiation from the deep (DUV) or vacuum ultraviolet range (VUV) can also be correspondingly constructed and operated.

TABLE 1

| Surface | Radius | Distance value | Operating mode |
|---|---|---|---|
| Image plane | Infinity | 852.884 | |
| M6 | −889.919 | −802.884 | REFL |
| M5 | −219.761 | 1800.787 | REFL |
| M4 | −999.946 | −434.619 | REFL |
| M3 | −1033.356 | 483.832 | REFL |
| M2 | 2464.083 | −947.116 | REFL |
| M1 | 1323.688 | 1047.116 | REFL |
| Object plane | Infinity | 0.000 | |

TABLE 2

| Coefficient | M6 | M5 | M4 |
|---|---|---|---|
| K | 3.303831E−03 | 2.041437E−02 | −1.056546E−01 |
| Y | 0.000000E+00 | 0.000000E+00 | 0.000000E+00 |
| X2 | 1.106645E+00 | 4.620513E+00 | 1.065419E+00 |
| Y2 | 1.316656E+00 | 4.632819E+00 | 2.089523E+00 |
| X2Y | −6.987016E−02 | 6.244905E−02 | 2.322141E−01 |
| Y3 | −1.544816E−01 | −2.303227E−01 | −2.158981E−01 |
| X4 | 3.297744E−02 | 9.371547E−02 | 7.579352E−02 |
| X2Y2 | 6.476911E−02 | 1.671737E−01 | 8.744751E−02 |
| Y4 | 5.431530E−02 | 7.743085E−02 | 2.360575E−01 |
| X4Y | −7.040479E−04 | 4.607809E−03 | 3.61681E−03 |
| X2Y3 | −6.159827E−03 | −1.034287E−02 | 9.782459E−03 |
| Y5 | −4.061987E−03 | −3.840440E−03 | −1.297054E−01 |
| X6 | 1.398226E−03 | 3.085471E−03 | 6.847894E−03 |
| X4Y2 | 2.977799E−03 | 8.906362E−03 | 6.372742E−03 |
| X2Y4 | 4.433992E−03 | 8.678073E−03 | −2.569810E−02 |
| Y6 | 1.255594E−03 | 1.683572E−03 | 9.106731E−02 |
| X6Y | 2.969767E−04 | 1.881484E−04 | 1.342374E−03 |
| X4Y3 | −2.820109E−04 | −1.123168E−03 | −5.896992E−03 |

TABLE 2-continued

| | | | |
|---|---|---|---|
| X2Y5 | −3.654895E−04 | −5.949903E−04 | 1.660704E−03 |
| Y7 | 8.966891E−05 | −3.952323E−04 | −3.764049E−02 |
| Nradius | 2.899772E+02 | 6.300046E+01 | 2.064580E+02 |

| Coefficient | M3 | M2 | M1 |
|---|---|---|---|
| K | 5.7446686E−01 | −3.325393E+02 | −1.583030E−02 |
| Y | 0.000000E+00 | 0.000000E+00 | 0.000000E+00 |
| X2 | 3.551408E−01 | 3.277030E−01 | −2.811984E−02 |
| Y2 | 2.123536E+00 | 1.609563E+00 | −4.135835E−01 |
| X2Y | 2.013521E−01 | −6.948142E−01 | −3.866470E−02 |
| Y3 | −1.210907E−02 | 3.694447E−01 | −1.853273E−02 |
| X4 | 5.478320E−02 | 1.369729E−01 | 1.349339E−03 |
| X2Y2 | 7.482002E−02 | 1.984843E−01 | 3.032808E−03 |
| Y4 | 8.327949E−02 | −1.227576E−01 | −2.824781E−03 |
| X4Y | −2.048831E−03 | −4.568931E−02 | −4.300195E−04 |
| X2Y3 | −4.029059E−03 | −1.713508E−02 | −6.501645E−04 |
| Y5 | −1.415756E−02 | 6.185385E−03 | 3.144628E−03 |
| X6 | 1.998416E−04 | −1.834856E−02 | 6.906841E−05 |
| X4Y2 | −1.979383E−03 | −3.309794E−02 | 5.274081E−05 |
| X2Y4 | −5.943296E−03 | −5.169942E−02 | −1.330272E−03 |
| Y6 | 1.246118E−03 | −1.603819E−01 | −1.363317E−02 |
| X6Y | 1.584327E−04 | 7.876367E−03 | −2.377257E−05 |
| X4Y3 | −3.187207E−04 | −1.244804E−02 | −2.251271E−04 |
| X2Y5 | −5.566691E−04 | −5.746055E−02 | −9.996573E−04 |
| Y7 | −1.399787E−03 | −3.870909E−02 | 4.001012E−03 |
| Nradius | 8.132829E+01 | 7.472082E+01 | 1.311311E+02 |

TABLE 3

| Coefficient | M6 | M5 | M4 | M3 | M2 | M1 | Image plane |
|---|---|---|---|---|---|---|---|
| Y-decenter | −51.252 | −99.408 | 123.654 | 215.631 | 528.818 | 512.855 | 0.000 |
| X-rotation | 0.323 | 7.067 | −2.444 | 10.483 | 16.940 | 3.488 | 0.000 |

What is claimed is:

1. A method of using a projection exposure apparatus comprising an illumination system and an anamorphic projection lens, the method comprising:
   using the illumination system to illuminate an illumination region of a mask which comprises a pattern, the mask being located in a region of an object plane of the anamorphic projection lens;
   using the anamorphic projection lens to project an illuminated part of the pattern of the mask onto a radiation-sensitive material located in an image plane of the anamorphic projection lens;
   synchronously moving the mask and the radiation-sensitive material in a respective scanning direction during a scan operation;
   rotating the mask by a first angle about a first axis oriented perpendicular to the object plane of the anamorphic lens; and
   rotating the radiation-sensitive material by a second angle about a second oriented perpendicular to the image plane of the anamorphic lens,
   wherein the rotation of the mask and the rotation of the radiation-sensitive material are coordinated with one another so that:
      for a first aberration caused by the rotation of the mask, a profile over the image field is set; and
      for a second image aberration caused by the rotation of the mask, a profile over the image field is compensated for by the rotation of the sub radiation-sensitive material to a greater extent than the profile of the first image aberration over the image field.

2. The method of claim 1, comprising synchronously rotating the mask and the radiation-sensitive material about the assigned rotation axes during the scan operation so that the rotation of the mask and the rotation of the radiation-sensitive material, in a time interval between the beginning and end of a scan operation proceeding in one direction, are effected synchronously with variation of the first and second rotation angles according to a predefinable movement profile.

3. The method of claim 2, wherein:
   the anamorphic projection lens has a first imaging scale in a first direction;
   the anamorphic projection lens has a second imaging scale in a second direction perpendicular to the first direction;
   the second imaging scale is different from the first imaging scale; and
   the first and second rotation angles are in a ratio to one another which corresponds to a ratio of the first and second imaging scales.

4. The method of claim 2, wherein:
   the anamorphic projection lens has a first imaging scale in a first direction;
   the anamorphic projection lens has a second imaging scale in a second direction perpendicular to the first direction;
   the second imaging scale is different from the first imaging scale; and
   the first and second rotation angles are in a ratio to one another which corresponds to a reciprocal of a ratio of the first and second imaging scales.

5. The method of claim 1, wherein:
   the anamorphic projection lens has a first imaging scale in a first direction;
   the anamorphic projection lens has a second imaging scale in a second direction perpendicular to the first direction;
   the second imaging scale is different from the first imaging scale; and
   the first and second rotation angles are in a ratio to one another which corresponds to a ratio of the first and second imaging scales.

6. The method of claim 1, wherein:
   the anamorphic projection lens has a first imaging scale in a first direction;
   the anamorphic projection lens has a second imaging scale in a second direction perpendicular to the first direction;
   the second imaging scale is different from the first imaging scale; and
   the first and second rotation angles are in a ratio to one another which corresponds to a reciprocal of a ratio of the first and second imaging scales.

7. The method of claim 1, further comprising:
   determining a movement profile for rotating the mask by the first angle and for rotation the radiation-sensitive material by the second angle; and
   synchronously rotating the mask by the first angle and the radiation-sensitive material by the second angle rotation axes during the scan operation according to the movement profile.

8. An apparatus configured to expose a radiation-sensitive material with an image of a pattern of a mask, the apparatus comprising:
- an illumination system configured to generate an illumination radiation directed onto the mask;
- an anamorphic projection lens configured to generate an image of the pattern in the region of an image plane of the projection lens;
- a mask holding unit configured to hold the mask between the illumination system and the projection lens so that the pattern is arranged in a region of an object plane of the anamorphic projection lens and so that the pattern is movable in a scanning direction perpendicular to a reference axis of the anamorphic projection lens;
- a substrate holding unit configured to hold the radiation-sensitive material so that the radiation-sensitive material is in a region of the image plane of the anamorphic projection lens, and so that the radiation-sensitive material is synchronously movable with the mask perpendicular to the reference axis of the projection lens; and
- a control unit, wherein:
- the image plane is optically conjugate to the object plane;
- the mask holding unit comprises a first rotation unit configured to controllably rotate the mask about a first rotation axis running orthogonally with respect to the object plane;
- the substrate holding unit comprises a second rotation unit configured to controllably rotate the radiation-sensitive material about a second rotation axis running orthogonally with respect to the image plane;
- the control unit is configured to rotate the mask holding unit and the substrate holding unit in a manner coordinated with each other so that:
  - for a first image aberration caused by the rotation of the mask, a profile over the image field is set; and
  - for a second image aberration caused by the rotation of the mask, a profile over the image field is compensated for by the rotation of the radiation-sensitive material to a greater extent than the profile of the first image aberration over the image field; and
- the apparatus is a projection exposure apparatus.

9. The apparatus of claim 8, wherein the first and second rotation units are configured so that a rotation of the mask and of the radiation-sensitive material, in a time interval between the beginning and end of a scan operation proceeding in one direction, is controllable according to a predefinable movement profile.

10. The apparatus of claim 9, wherein:
- the anamorphic projection lens has a first imaging scale in a first direction;
- the anamorphic projection lens has a second imaging scale in a second direction perpendicular to the first direction;
- the second imaging scale is different from the first imaging scale; and
- the first and second rotation angles are in a ratio to one another which corresponds to a ratio of the first and second imaging scales.

11. The apparatus of claim 9, wherein:
the anamorphic projection lens has a first imaging scale in a first direction;
the anamorphic projection lens has a second imaging scale in a second direction perpendicular to the first direction;
the second imaging scale is different from the first imaging scale; and
the first and second rotation angles are in a ratio to one another which corresponds to a reciprocal of a ratio of the first and second imaging scales.

12. The apparatus of claim 8, wherein:
the anamorphic projection lens has a first imaging scale in a first direction;
the anamorphic projection lens has a second imaging scale in a second direction perpendicular to the first direction;
the second imaging scale is different from the first imaging scale; and
the first and second rotation angles are in a ratio to one another which corresponds to a ratio of the first and second imaging scales.

13. The apparatus of claim 8, wherein:
the anamorphic projection lens has a first imaging scale in a first direction;
the anamorphic projection lens has a second imaging scale in a second direction perpendicular to the first direction;
the second imaging scale is different from the first imaging scale; and
the first and second rotation angles are in a ratio to one another which corresponds to a reciprocal of a ratio of the first and second imaging scales.

14. The apparatus of claim 8, wherein control unit is configured to:
- determine a movement profile for rotating the mask by the first angle and for rotation the radiation-sensitive material by the second angle; and
- synchronously rotate the mask by the first angle and the radiation-sensitive material by the second angle rotation axes during the scan operation according to the movement profile.

15. An apparatus, comprising:
- an illumination system configured provide an illumination radiation directed onto at least a portion of a pattern of a mask;
- an anamorphic projection lens configured to generate an image of at least a portion of the illuminated portion of the pattern of the mask, in the region of an image plane of the projection lens; and
- a control unit, wherein:
- the mask is located in a region of an object plane of the anamorphic projection lens;
- the radiation-sensitive material is located in a region of an image plane of the anamorphic lens;
- the image plane is optically conjugate to the object plane;
- the control unit is configured to rotate the mask and the radiation-sensitive material so that:
  - the rotation of the mask causes first and second image aberrations over the image field;
  - a profile of the first aberration over the image field is set; and
  - a profile of the second aberration over the image field is compensated for by the rotation of the radiation-sensitive material to a greater extent than the profile of the first image aberration over the image field; and
- the apparatus is a projection exposure apparatus.

16. The apparatus of claim 15, wherein the apparatus is configured so that rotation of the mask and of the radiation-sensitive material, in a time interval between the beginning and end of a scan operation proceeding in one direction, is controllable according to a predefinable movement profile.

17. The apparatus of claim 16, wherein:
the anamorphic projection lens has a first imaging scale in a first direction;
the anamorphic projection lens has a second imaging scale in a second direction perpendicular to the first direction;
the second imaging scale is different from the first imaging scale; and
the first and second rotation angles are in a ratio to one another which corresponds to a ratio of the first and second imaging scales.

18. The apparatus of claim 16, wherein:
the anamorphic projection lens has a first imaging scale in a first direction;
the anamorphic projection lens has a second imaging scale in a second direction perpendicular to the first direction;
the second imaging scale is different from the first imaging scale; and
the first and second rotation angles are in a ratio to one another which corresponds to a reciprocal of a ratio of the first and second imaging scales.

19. The apparatus of claim 15, wherein:
the anamorphic projection lens has a first imaging scale in a first direction;
the anamorphic projection lens has a second imaging scale in a second direction perpendicular to the first direction;
the second imaging scale is different from the first imaging scale; and
the first and second rotation angles are in a ratio to one another which corresponds to a ratio of the first and second imaging scales.

20. The apparatus of claim 15, wherein:
the anamorphic projection lens has a first imaging scale in a first direction;
the anamorphic projection lens has a second imaging scale in a second direction perpendicular to the first direction;
the second imaging scale is different from the first imaging scale; and
the first and second rotation angles are in a ratio to one another which corresponds to a reciprocal of a ratio of the first and second imaging scales.

* * * * *

UNITED STATES PATENT AND TRADEMARK OFFICE
CERTIFICATE OF CORRECTION

PATENT NO. : 9,933,710 B2
APPLICATION NO. : 15/470007
DATED : April 3, 2018
INVENTOR(S) : Stephan Andre et al.

Page 1 of 1

It is certified that error appears in the above-identified patent and that said Letters Patent is hereby corrected as shown below:

In the Specification

Column 17, Line 7 (approx.): Delete "5.7446686E-01" and insert -- 5.744686E-01 --, therefor.

Column 17, Line 31 (approx.): Delete "-99.408" and insert -- -99.406 --, therefor.

Column 17, Line 32 (approx.): Delete "10.483" and insert -- 10.463 --, therefor.

In the Claims

Column 17, Line 63, Claim 1: After "of the" delete "sub".

Column 18, Line 62, Claim 7: After "rotation" insert -- of --.

Column 20, Line 34 (approx.), Claim 14: After "rotation" insert -- of --.

Column 20, Line 41 (approx.), Claim 15: After "configured" insert -- to --.

Signed and Sealed this
Second Day of June, 2020

Andrei Iancu
*Director of the United States Patent and Trademark Office*